United States Patent
Ru

(12) United States Patent     (10) Patent No.: US 6,800,211 B2
(45) Date of Patent: Oct. 5, 2004

(54) METHOD FOR REMOVING VOIDS IN A CERAMIC SUBSTRATE

(75) Inventor: Shao-Pin Ru, Taipei (TW)

(73) Assignee: Tong Hsing Electric Industries Ltd., Taipei (TW)

( * ) Notice: Subject to any disclaimer, the term of this patent is extended or adjusted under 35 U.S.C. 154(b) by 208 days.

(21) Appl. No.: 10/227,969

(22) Filed: Aug. 26, 2002

(65) Prior Publication Data

US 2004/0035693 A1 Feb. 26, 2004

(51) Int. Cl.$^7$ .................... H01B 13/00; H01K 3/10
(52) U.S. Cl. .................................. 216/18; 29/852
(58) Field of Search .................. 216/13, 17, 18; 29/825, 829, 830, 846, 847, 852; 174/256, 266; 361/748, 751

(56) References Cited

U.S. PATENT DOCUMENTS 5,153,384 A * 10/1992 Iijima et al. ............... 174/257
5,354,415 A * 10/1994 Fushii et al. ................ 216/13
5,827,604 A * 10/1998 Uno et al. ................... 428/209
6,172,305 B1 * 1/2001 Tanahashi ................... 174/255

* cited by examiner

Primary Examiner—Gregory Mills
Assistant Examiner—Roberts Culbert
(74) Attorney, Agent, or Firm—Alan D. Kamrath; Nikolai & Mersereau, P.A.

(57) ABSTRACT

A method for removing voids in a ceramic substrate includes steps of preparing a ceramic substrate and defining holes of different dimensions in the ceramic substrate, sputtering a titanium/copper film onto opposite sides of the ceramic substrate, chemical copper plating, forming a dry film onto the ceramic substrate, forming an image, plating copper leads, plating nickel and gold, removing the dry film, and etching titanium/copper.

1 Claim, 2 Drawing Sheets

METHOD FOR REMOVING VOIDS IN A CERAMIC SUBSTRATE

BACKGROUND OF THE INVENTION

1. Field of the Invention

The present invention relates to a method for removing voids in a ceramic substrate, and more particularly to a method including a chemical copper plating process after a sputtering titanium/copper step. The chemical copper plating step is able to successfully and electrically communicate both sides of the ceramic substrate so that when the copper pattern is formed on both sides of the ceramic substrate, communication is established.

2. Description of Related Art

Conventional leads of printed circuit ceramic substrates are made through a special metal mask in a vacuum environment by sputtering technology or evaporating technology. Because the leads are very thin and some oxide or nitride is mixed in the leads, it is necessary to use the ceramic substrate with high flatness, and an alumina material purity of 99.6%. Due to the above reason, the cost of the fabrication is very high.

For another conventional process of printed circuit ceramic substrates, the cost is low, but the flatness of the circuit is not satisfactory to reach the requirement of a high frequency circuit. The best width of the leads and width between each lead is 6 mil. For high frequency circuits, this process can not meet the requirements thereof. Furthermore, while preparing a ceramic substrate, titanium/copper sputtering is employed to communicate both sides of the substrate. However, because there are holes defined in the ceramic substrate and if the dimension of some of the holes is smaller than $100\mu$, the process of sputtering is not able to ensure that all the holes are covered with a layer of titanium/copper so that when the pattern is formed on the substrate, communication between both sides of the ceramic substrate is not satisfactory.

Therefore, it is an objective of the invention to provide an improved method to mitigate and/or obviate the aforementioned problems.

SUMMARY OF THE INVENTION

The primary objective of the present invention is to provide an improved method to satisfactorily establish communication between both sides of a ceramic substrate.

The method comprises defining holes in a ceramic substrate, sputtering titanium/copper film onto the ceramic substrate, chemical copper plating the ceramic substrate, forming a dry film onto the ceramic substrate, forming an image on the ceramic substrate, which consists of exposure and development, plating copper leads, plating nickel and gold, removing dry film, and etching titanium/copper.

Other objects, advantages and novel features of the invention will become more apparent from the following detailed description when taken in conjunction with the accompanying drawings.

DETAILED DESCRIPTION OF THE PREFERRED EMBODIMENT

Figure 1:
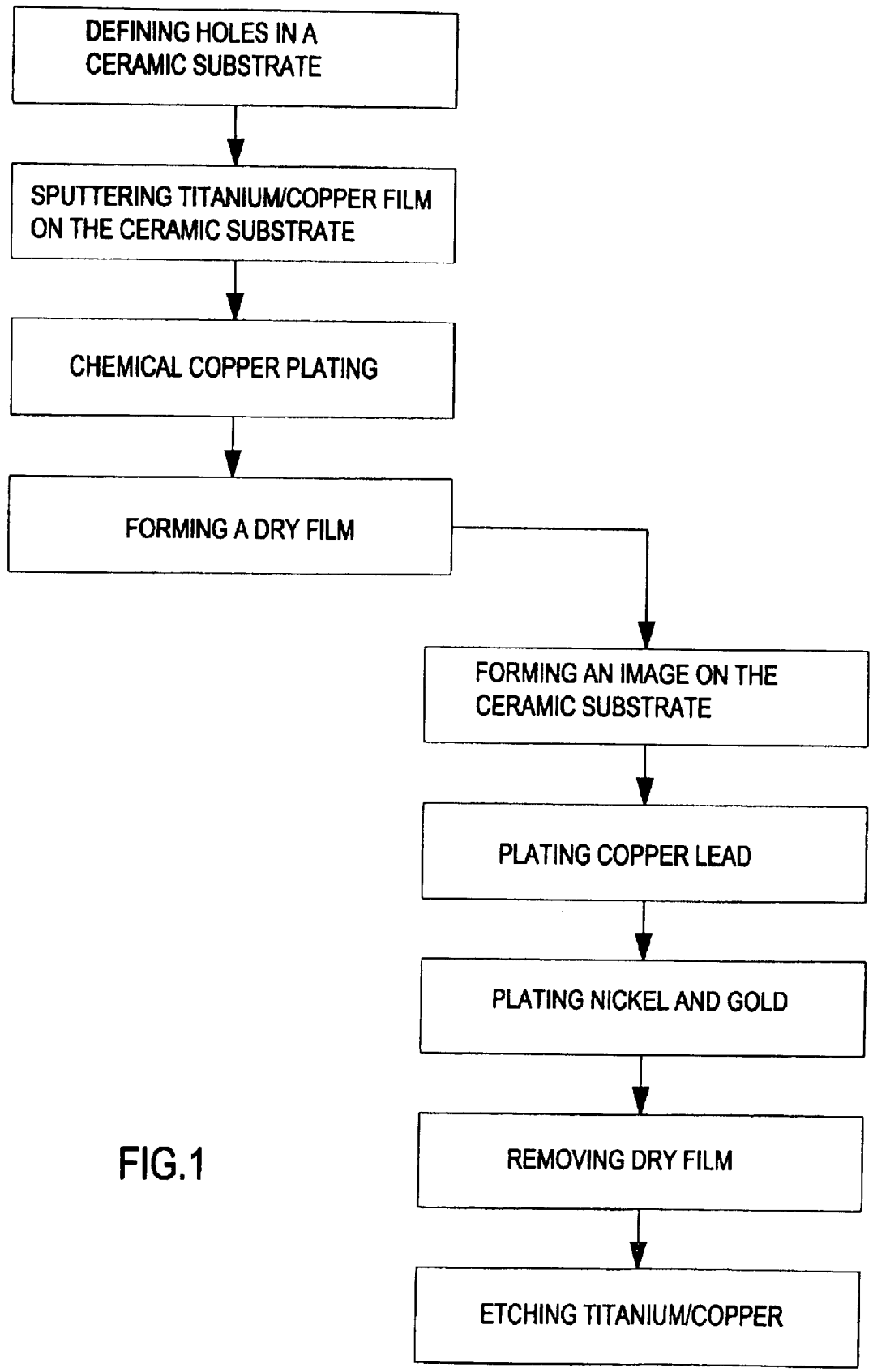
FIG. 1 is a flow chart of the method in accordance with the present invention.

With reference to FIG. 1, the method in accordance with the present invention for a ceramic substrate comprises the steps of:

preparing a ceramic substrate and defining holes of different dimensions in the ceramic substrate;

sputtering a titanium/copper film onto opposite sides of the ceramic substrate;

Copper and titanium are separately sputtered on opposite sides of the ceramic substrate so that the ceramic substrate is covered with a copper layer and a titanium layer.

chemical copper plating;

If the dimension of some of the holes in the ceramic substrate is smaller than $100\mu$, neither copper nor titanium can be applied to an inner peripheries of the holes by sputtering, which will seriously hinder communication between opposite sides of the ceramic substrate. In order to obviate the foregoing shortcoming, a step of chemical copper plating is implemented. The communication between the opposite sides of the ceramic substrate is satisfactorily established after the chemical copper plating.

forming a dry film onto the ceramic substrate;

forming an image, which consists of exposure and development;

plating copper leads, wherein copper leads are formed on the ceramic substrate by plating;

plating nickel and gold;

removing the dry film; and etching titanium/copper.

With reference to FIGS. 2A to 2G and taking FIG. 1 as reference, a ceramic substrate (10) is provided with holes (100) defined in the ceramic substrate (10). In the titanium/copper sputtering step, a titanium film (11) and a copper film (12) are respectively and orderly formed on a surface of the ceramic substrate (10) by sputtering technology. A thickness of the titanium film (11) is 3000 angstroms (Å) and a thickness of the copper film (12) is 4000 angstroms. The titanium film (11) and the copper film (12) are useful to plating copper leads (15) on the ceramic substrate (10).

Figure 2E:
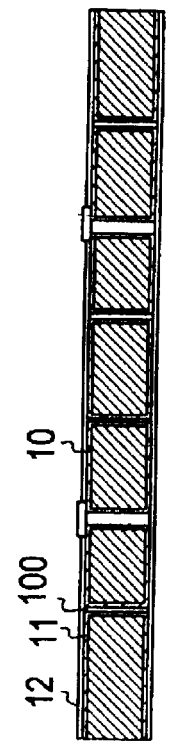
FIGS. 2A-2G are cross-sectional views showing structure changes of the ceramic substrate of the method of the present invention.
Figure 2F:
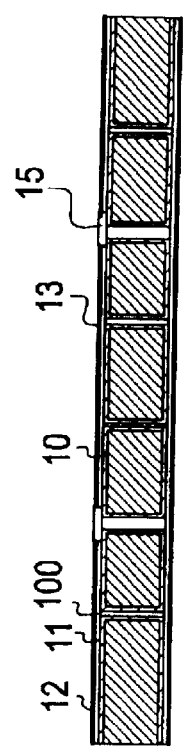
Figure 2G:
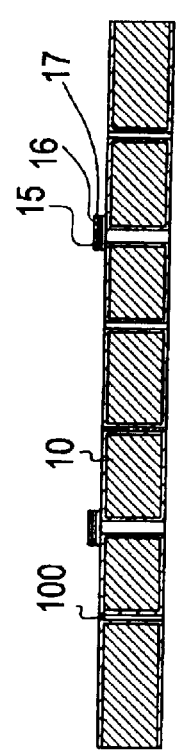
Figure 2A:
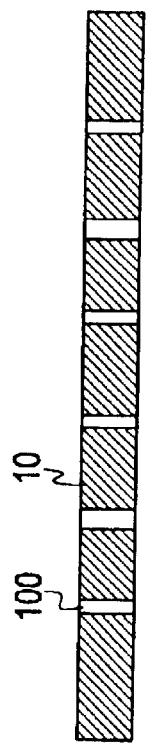
Figure 2B:
Figure 2C:
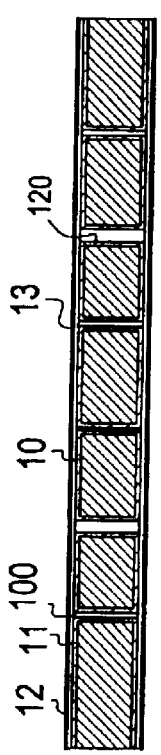

FIG. 2B shows that in the titanium/copper sputtering step, some of the holes (100) have a dimension smaller than $100\mu$ and the sputtering technology can not fill the holes (100) with electrical conducting substance, the titanium and the copper. Therefore, after the chemical copper plating step, a copper layer (120) fills the holes (100) to satisfactorily communicate both sides of the ceramic substrate (10). In the dry film forming step, as shown in FIG. 2C, a dry film (13) is securely formed on a surface of the copper film (12). The dry film (13) is a resin polymer, which will react with itself under ultraviolet radiation in order to protect the leads (15) under the dry film (13).

The image formation consists of the exposure process and the development process.

Figure 2D:
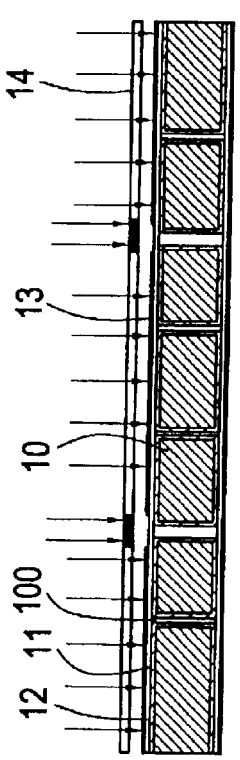

FIG. 2D shows the exposure process. According to an artwork of the circuit diagram, a photomask (14) is made using conventional photomask technology. The photomask (14) is flatly positioned and adhered to the dry film (13) of the ceramic substrate (10). Then the ceramic substrate (10) with the photomask (14) is sent into an exposing chamber. After creating a vacuum in the exposing chamber, ultraviolet rays irradiate the dry film (13) through the photomask (14). The dry film (13), which is irradiated by the ultraviolet rays through the photomask (14), is polymerized by the ultraviolet radiation, and the dry film (13), which is not irradiated by the ultraviolet rays, does not react and keeps its chemical composition.

The development process etches the polymerized part of the dry film (13) by chemical cleaning or physical cleaning. In this way, some parts of the copper film (12) are exposed from the dry film (13), and those parts of the copper film (12) will form the required circuit diagram as per the artwork of the circuit diagram in order to produce the required copper leads (15) of a circuit on the ceramic substrate (10). In this way, the artwork of the circuit diagram can be printed on the dry film (13).

FIG. 2E shows the plating copper leads process. Copper is applied to fill the exposed parts of the dry film (13) on the ceramic substrate (10) with suitable width and thickness by plating technology to form the copper leads (15). By the above process, the leads (15) of the circuit have slender, flat and smooth characteristics. Due to the plating technology, the conductivity characteristics and the heat dissipation are good.

FIGS. 2F and 2G shows the nickel and gold plating processes. The nickel and gold are deposited on an upper surface of the copper leads (15) to form a nickel film (16) and a gold film thereon. The nickel film (16) prevents the atoms of the gold film (17) diffusing into the copper leads (15). The gold film (17) improves the performance of the circuit under high frequency environment. An optical resistance is formed on the upper surface of the copper leads (15). Then the remaining dry film (13) on the ceramic substrate (10) is removed.

After the stripping dry film process, the copper leads (15) are protected by the optical resistance. The detaching titanium/copper film process etches the copper film (12) and the titanium film (11) not protected by the optical resistance.

The invention has the following advantages:

1. High straightness and flatness:

Due to the present DPC process for printed circuit ceramic substrates, the leads of the ceramic substrate can achieve the requirement of high frequency, high density, high efficiency, and low cost for the high frequency circuit.

2. High conductivity and heat dissipation:

Because the leads of the circuit have slender, flat and smooth characteristics, the conductivity and the heat dissipation thereof are high. Due to the plating technology, the process can produce the copper leads with suitable width and thickness. Because of the above characteristics of the copper leads, the leads can provide required HF characteristics, steady physical performance and low transmission cost.

3. Low manufacture cost

Because the ceramic substrate can be made with common aluminum material, the cost thereof is low.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims, are expressed.

What is claimed is:

1. A method for removing voids in a ceramic substrate, the method comprising:

preparing a ceramic substrate and defining holes of different dimensions in the ceramic substrate;

sputtering a titanium/copper film onto opposite sides of the ceramic substrate, wherein copper and titanium are separately sputtered on opposite sides of the ceramic substrate so that the ceramic substrate is covered with a copper layer and a titanium layer;

chemical copper plating, wherein by way of chemical copper plating, electrical communication between opposite sides of the ceramic substrate is established after the chemical copper plating;

forming a dry film onto the ceramic substrate;

forming an image, which consists of exposure and development;

plating copper leads, wherein copper leads are formed on the ceramic substrate by plating;

plating nickel and gold; and etching titanium/copper.

\* \* \* \* \*